United States Patent [19]

Tang

[11] 4,027,283

[45] May 31, 1977

[54] RESYNCHRONIZABLE BUBBLE MEMORY

[75] Inventor: Donald T. Tang, Yorktown Heights, N.Y.

[73] Assignee: International Business Machines Corporation, Armonk, N.Y.

[22] Filed: Sept. 22, 1975

[21] Appl. No.: 615,638

[52] U.S. Cl. .................. 340/146.1 D; 340/174 TC
[51] Int. Cl.² ................ G11C 29/00; G11C 11/14
[58] Field of Search ............ 340/146.1 D, 174 TF, 340/174 ED, 172.5; 178/69.5; 179/15 BS; 360/26

[56] References Cited

UNITED STATES PATENTS

| | | | |
|---|---|---|---|
| 3,336,467 | 8/1967 | Frey, Jr. ..................... | 340/146.1 D |
| 3,463,911 | 8/1969 | Dupraz et al. ............. | 340/146.1 D |
| 3,648,237 | 3/1972 | Frey, Jr. et al. ............ | 340/146.1 D |
| 3,766,316 | 10/1973 | Hoffman et al. ............ | 178/69.5 R |
| 3,792,450 | 2/1974 | Bogar et al. ................. | 340/174 ED |
| 3,854,011 | 12/1974 | Mallory et al. .............. | 179/15 BS |
| 3,860,907 | 1/1975 | Marshall ...................... | 340/174 ED |
| 3,903,371 | 9/1975 | Colton et al. ................ | 179/15 BS |
| 3,909,810 | 9/1975 | Naden et al. ................ | 340/174 TF |
| 3,921,156 | 11/1975 | Yoshimi ....................... | 340/174 ED |

*Primary Examiner*—Charles E. Atkinson
*Attorney, Agent, or Firm*—Sughrue, Rothwell, Mion, Zinn & Macpeak

[57] ABSTRACT

A method and apparatus for the recovery of loop frame synchronization in a magnetic bubble domain memory are disclosed. One loop of the memory is used to store the parity of corresponding bits for the other loops. A special sequence of even/odd parity pattern with a peaked autocorrelation function is inserted at the end or start of the loop frame in place of the normal even or odd parity in the parity loop. The special sequence of even/odd parity pattern is detected by a pattern recognizer to re-establish loop frame synchronization.

10 Claims, 5 Drawing Figures

RESYNCHRONIZABLE BUBBLE MEMORY

BACKGROUND OF THE INVENTION

The present invention generally relates to memory systems, and more particularly to a technique for the recovery of frame synchronization in dynamic, non-destructive memory systems. The invention is especially useful in the recovery of loop frame synchronization in a magnetic bubble domain mass-memory.

Magnetic bubble domains in soft magnetic thin films provide large-capacity information storage of high reliability at very low cost. Thin film magnetic bubble memories permit information to be processed in two dimensions and provide both non-destructive read-out and logic operations. A good general description of magnetic bubble domains and their potential applications is provided by Andrew H. Bobeck and H. E. D. Scovil in their article entitled, "Magnetic Bubbles" published in the June, 1971 issue of *Scientific American* at pages 78 to 90.

The present invention will be described primarily in terms of a bubble mass-memory organized so that a number of minor loops hold data and transfer the data on command into a major loop for read-out as described on Page 90 of the Bobeck and Scovil article. In such a memory, the magnetic bubbles are typically moved in the thin film by means of a rotating magnetic field acting in conjunction with a pattern of thin-films of Permalloy on the soft magnetic thin film and having special geometric shapes. One of the main advantages of a bubble memory of this type is that it is non-destructive as far as the data are concerned; however, loop frame synchronization usually depends on the information in the control hardware which is typically Large Scale Implementation (LSI) semiconductor circuitry. This circuitry is data-destructive in nature upon catastrophic failures such as power failures or the like. Recovery of the loop frame synchronization after a power failure, for instance, becomes an important problem if the data in the memory are to be usable.

One approach which might be used to permit resynchronization of the loop frame data is to assign a number of bits at the beginning of the frame as synchronization word or header block. Such a technique is typically used in digital communications. Although this would be a reasonable approach in loop recynchronization in bubble memories, each loop in the memory would require such a header block resulting in a space redundancy and requiring additional logic, making it unattractive, especially when the loops are not big in size.

SUMMARY OF THE INVENTION

The present invention takes advantage of the redundancy checks used for error control purposes to permit the recovery of loop frame synchronization. More specifically, one loop of the memory is typically used to store the parity of corresponding bits for the other loops. In the practice of my invention, I provide a special sequence of even/odd parity patterns with a peaked autocorrelation function at the end or the start of the loop frame in place of the normal even or odd parity in the parity loop. For example, even parities may be used in all bit positions except that a sequence of odd, odd, even, odd parities for the last four bit positions ends the loop frame. This particular special sequence of even/odd parity has the desired peaked autocorrelation function, but other binary sequences are known which exhibit this desired peaked autocorrelation function. In general, the longer the special sequence, the higher the autocorrelation peak and the greater the safeguard against error in resynchronization. Obviously, a trade-off must be made between hardware complexity and permissible error rate in frame resynchronization. Thus, the four bit binary word one, one, zero, one is a good compromise choice for the special sequence even/odd parity pattern. In loop frame resynchronization after restoration of power after a power failure, for example, this special sequence is readily detected by a pattern recognizer of simple construction.

BRIEF DESCRIPTION OF THE DRAWINGS

The preferred embodiments of the invention will be described with greater detail with reference to the drawings wherein.

DESCRIPTION OF THE PREFERRED EMBODIMENTS

Figure 1:
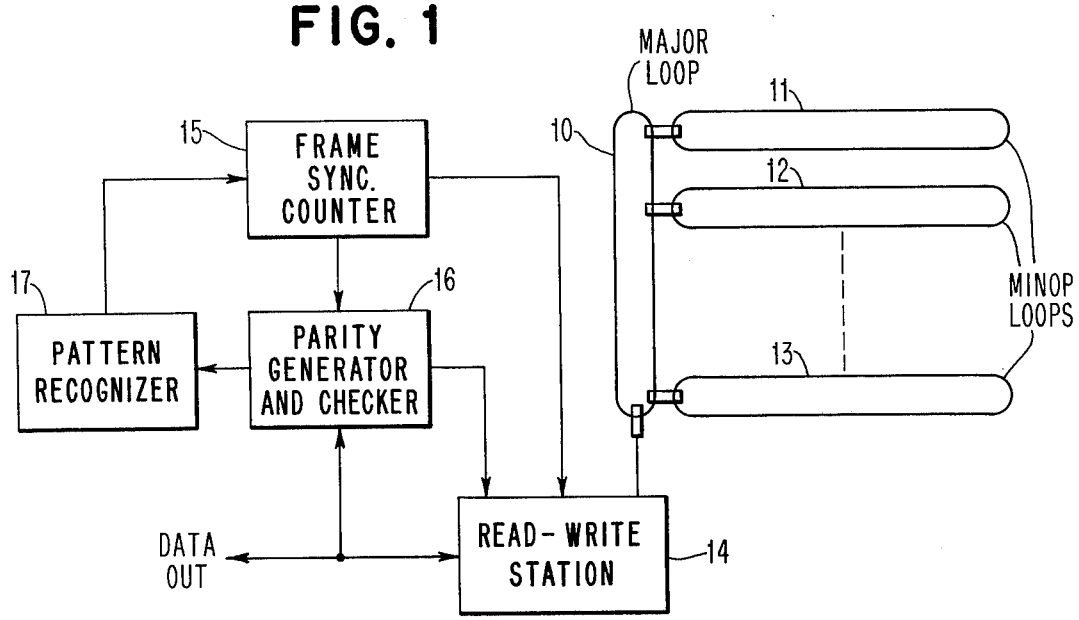
FIG. 1 is a block diagram illustrating how the invention is applied to a bubble memory of the type comprising a major and minor loop configuration.

FIG. 1 of the drawings illustrates a major/minor loop bubble memory structure which comprises a major loop 10 and a plurality of minor loops 11, 12 and 13. The minor loops 11, 12, etc. hold data which are constantly being recirculated in the loops under the control of the rotating magnetic field. Access to the data in the several minor loops is by means of the major loop 10. Transfer of data between the minor loops and the major loop is effected on command under the control of the read-write station 14. For purposes of error control, the minor loop 13 is dedicated to storing the parity bits in the bubble memory. More specifically, each bit position in minor loop 13 stores the parity of the corresponding bits of the other loops 11, 12, etc. For purposes of this description, if the minor loops 11, 12 and 13 are considered to be horizontal rows in a grid pattern and corresponding bit positions within the minor loops are considered to be the vertical columns of that grid pattern, then the parity check employed may be described as a vertical parity.

The system as thus far described, excluding the parity check, which is itself conventional, is described in the above-referenced Bobeck and Scovil article. Further details on the manner in which data is transferred between major and minor loops and the read/write operations may be had with reference to that article.

According to my invention, a special sequence of even/odd parity pattern with a peaked autocorrelation function is inserted at the end or the start of the loop frame data stored in the minor loop 13. Under normal conditions, the frame synchronization counter and pattern generator will track the loop frame synchronization pattern and generate the sequence one, one, zero, one at the end of a loop frame which is fed to the parity generator and checker 16. The parity generator and checker 16 comprises a modulo 2 adder which adds up incoming bits from the data input and generates a parity bit, thereby enabling the system to perform apparent even parity checks in both read and write operations. However, when synchronization is to be re-established after, for example, a power failure, the frame synchronization counter 15 is disabled and the system runs through a read cycle until the parity generator 16 outputs the special sequence parity pattern one, one, zero, one. This pattern is readily detected by the pattern recognizer 17 which in turn initiates the frame synchronization counter 15. Loop frame synchronization is thus re-established by the pattern recognizer 17. This operation will be described in more detail hereinafter. In should be understood at this point, however, that the system thus far described, while a preferred embodiment, is intended to be illustrative of the broad concept of my invention which is not limited to this specific example. For example, my invention clearly works as well in a one-loop-per-chip bubble memory structure as long as vertical redundancy checks across the loops are present. Moreover, those skilled in the art will recognize that while my invention is particularly applicable to bubble domain memory systems, it is not so limited and could be practiced in other dynamic common non-destructive memory systems including, for example, disc memories.

Figure 2:
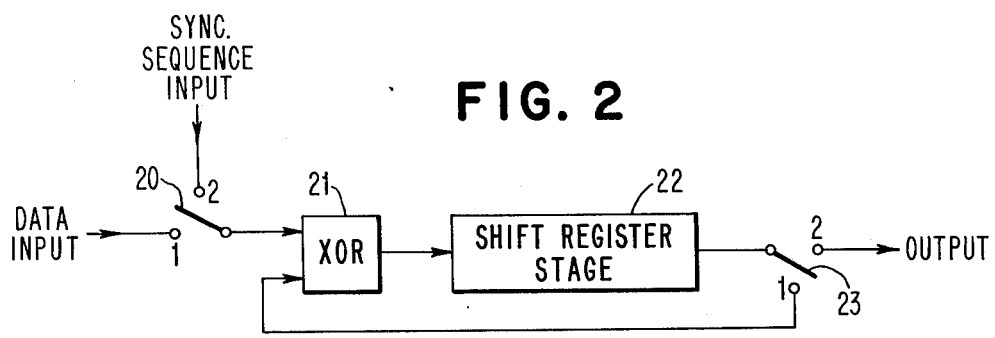
FIG. 2 is a logic diagram of a modified parity check generator which can be used in the system shown in FIG. 1.

I will now describe the implementation of my invention in more detail in the context of the two preferred embodiments for magnetic domain bubble memory systems. In the first case, a bubble memory having a major/minor loop configuration is contemplated. In this case, we will define $m$ to be the number of minor loops, i.e. there are $m - 1$ data loops and one parity loop, and we will define $l$ as the length of the minor loops. The parity generator and checker used for this memory system is illustrated in FIG. 2 of the drawings. This is a sequential parity generator and checker since the data read out of the major loop 10 is serial. A switch 20 is connected to one input of the exclusive OR gate 21. Terminal 1 of switch 20 is connected to the data input, whereas terminal 2 is connected to receive the synchronization sequence, in this case one, one, zero, one. The output of the exclusive OR gate 21 is connected to a shift register stage 22. This shift register stage 22 acts as a 1-bit delay and provides an output to the switch 23. Terminal 1 of switch 23 is connected to the second input of the exclusive OR gate 21, whereas terminal 2 of switch 23 is connected to the output of the parity generator and checker.

There are three modes of operation for the parity generator and checker. These are the "write" mode, the "read" mode, and the "synchronization" mode. In the write mode, the switches 20 and 23 are initially contacting their respective terminals 1. A block of $m - 1$ bits of data followed by a zero is fed to the data input and hence to the exclusive OR gate 21. Exclusive OR 21 and the shift register stage 22 perform modulo 2 addition on this block of $m$ bits of data. Switch 20 is then switched to contact its number 2 terminal to take 1 bit of the synchronization sequence at bit time $m + 1$. Switch 23 is then switched to position 2 at bit time $m + 2$ to feed the modified parity bit to the output and clear the shift register stage 22.

In the read mode, switches 20 and 23 are initially positioned at their respective terminals 1. $m - 1$ bits of data plus one modified parity bit is fed to the exclusive OR gate 21 which, with the shift register stage 22, performs modulo 2 addition on the data and parity bit. Switch 20 is then switched to position 2 to take one bit of the synchronization sequence at bit time $m + 1$. Thereafter, switch 23 is switched to position 2. A 1 at the output indicates a detected error.

In the synchronization mode switches 20 and 23 are again initially positioned at their respective terminals 1. $m - 1$ bits of data plus 1 modified parity bit is fed to the exclusive OR gate 21. It will be recalled that during the synchronization mode, the frame synchronization counter and pattern generator is disabled. Therefore, no input is provided at terminal 2 of switch 20. Switch 23 is then switched to its No. 2 terminal to provide as an output 1 bit of the synchronization sequence.

Figure 3:
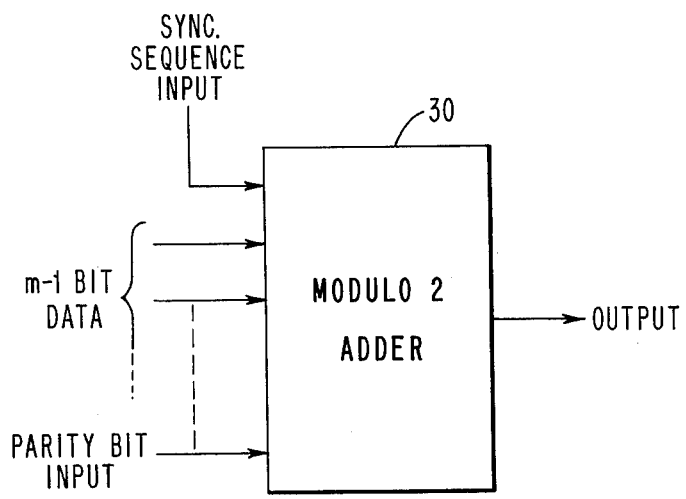
FIG. 3 is a block diagram of a modified parity check generator which can be used in an alternative embodiment of my invention.

From the foregoing, it will be apparent that the parity generator and checker is used to generate a modified parity check bit in the normal write mode, to check errors by regenerating the modified parity in the normal read mode, and to generate the synchronization sequence in the synchronization mode. In the case where the bubble memory system is implemented with one loop per chip, the same operations are performed in parallel rather than sequentially. In this case, $m$ is defined as the number of chips, i.e. there are $m - 1$ data chips and one parity chip, and $l$ is again defined as the length of the loop. The parity generator and checker for this type of bubble memory system is illustrated in FIG. 3 of the drawings. This simply comprises a modulo 2 adder 30 which may be implemented by a tree of exclusive OR gates as is well known in the art. Modolo 2 adder 30 receives in parallel the synchronization sequence, $m - 1$ bits of data and the parity bits to provide an output. This parity generator and checker also has three modes of operation.

In the write mode, the input is $m - 1$ bits of data, 1 bit of synchronization sequence, and a zero at the parity bit input. This produces 1 bit of a modified parity bit at the output.

In the read mode, the input again includes $m - 1$ bits of data, and one bit of the synchronization sequence but this time includes one modified parity bit. A 1 at the output indicates a detected error.

In synchronization mode, the input includes $m - 1$ bits of data, one modified parity bit and a zero for the synchronization sequence bit input. One bit of synchronization sequence is generated at the output.

Figure 4:
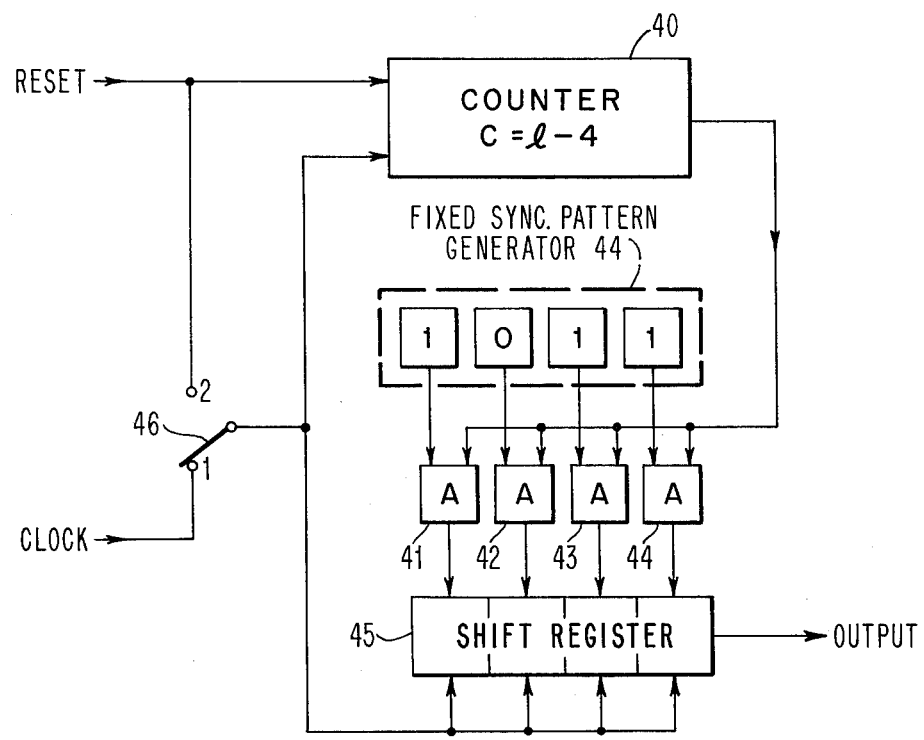
FIG. 4 is a logic diagram of the frame synchronization counter and sequence generator used in the system shown in FIG. 1.

FIG. 4 illustrates one embodiment of the frame synchronization counter and pattern generator. This includes a binary counter 40 which counts to $l - 4$ before recycling. The output of the counter 40 is used to enable AND gates 41 to 43. These AND gates are connected to receive as inputs respective bits from a fixed synchronization pattern generator 44 which may be, for example, a read only memory (ROM). When AND gates 41 to 43 are enabled by the output of the counter 40, the output of the fixed synchronization pattern generator 44 is transferred in parallel to the 4 stage shift register 45. The clock inputs to both the binary counter 40 and the 4 stage shift register 45 are connected to a switch 46.

The frame synchronization counter and pattern generator also has three modes; however, the write and read modes are identical. In these modes, clock pulses which advance the counter 40 and the shift register 45 are set at the rate that the minor loop bits are accessed. The switch 46 is positioned at its terminal 1. The counter 40 provides a 1 output when the count reaches $l - 4$ (or $l - k$ for a $k$ bit synchronization sequence). The output of counter 40 enables the AND gates 41 to 43 to transfer the fixed synchronization pattern into the shift register 45 so that the 4 bit synchronization sequence appears next at the output. After $l$ clock pulses the counter 40 is reset to zero to begin the cycle anew.

In the synchronization mode, the switch 46 is positioned at its terminal 2 thereby disabling the counter 40 and the shift register 5. The shift register contents are cleared. A reset pulse generated by the pattern recognizer resets the counter to zero and returns the switch 46 to its terminal 1.

Figure 5:
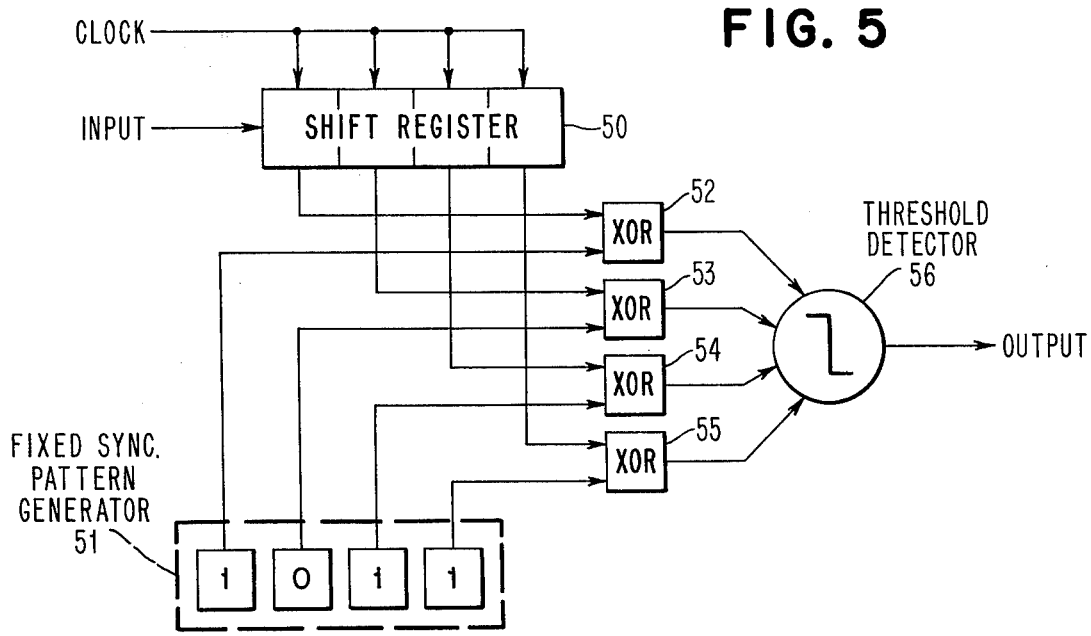
FIG. 5 is a logic diagram of a synchronization pattern recognizer and reset pulse generator used in the system shown in FIG. 1 of the drawings.

The synchronization pattern recognizer is shown in FIG. 5 of the drawings. This includes a four stage shift register 50 and a fixed synchronization pattern generator 51. The fixed synchronization pattern generator 51 may be the same as that shown in FIG. 4 and, in any case, preferably comprises a ROM. The output of the parity generator and checker is provided as the serial input to the four stage shift register 50. The four stage shift register 50 is clocked at the rate at which the minor loop bits are accessed. Corresponding bit positions of the four stage shift register 50 and the fixed synchronization pattern generator 51 are connected to respective exclusive OR gates 52 to 55. The output of these exclusive OR gates are connected to a threshold detector 56. In the specific example being described, where the synchronization pattern is one, one, zero, one, a threshold of 1½ is illustratively chosen for the threshold detector 56. The output of the threshold detector 56 is the reset pulse for the frame synchronization counter and pattern generator.

In the write and read modes, the pattern recognizer is disabled. There is no input, and the shift register 50 is cleared. In the synchronization mode, on the other hand, the output from the parity generator and checker is constantly shifted into the shift register 50 to be compared with the fixed synchronization pattern. The threshold detector 56 provides a 1 output if one or none of its inputs is a 1. The output of the threshold detector 56 is zero if two or more of its inputs are one. The one at the output of the threshold detector indicates a matching condition (allowing for 1 bit error), and the output of the threshold detector is used to reset the frame synchronization counter and pattern generator thereby re-establishing loop frame synchronization.

From the foregoing, it will be apparent that the embodiments shown and described are only exemplary and that various modifications can be made in the practice, construction and arrangement within the scope of the invention as defined in the appended Claims.

I claim:

1. A method of recovering the frame synchronization in a dynamic, non-destructive memory system of the type having a plurality of recirculating data loops and a recirculating loop used to store the parity of corresponding bits in the data loops comprising the steps of:
    a. inserting a special sequence of parity pattern exhibiting a peaked autocorrelation function at the end or start of the frame in place of the normal parity in the parity loop;
    b. detecting said special sequence of parity pattern; and
    c. re-establishing frame synchronization upon the detection of said special sequence of parity pattern.

2. The method as recited in claim 1 wherein the memory system is a magnetic bubble domain memory having a major/minor loop configuration and the steps of inserting and detecting are performed serially.

3. The method as recited in claim 1 wherein the memory system is a magnetic bubble domain memory having a one-loop-per-chip structure and the steps of inserting and detecting are performed in parallel.

4. In a dynamic, non-destructive memory system of the type having a plurality of recirculating data loops and a recirculating loop used to store the parity of corresponding bits of the data loops and including means for reading and writing data and parity bits in said recirculating loops, the improvement for recovering loop frame synchronization comprising:
    a. means connected to said reading and writing means for inserting a special sequence of parity pattern exhibiting a peaked autocorrelation function at the end or start of the frame in place of the normal parity in the parity loop;
    b. detecting means responsive to said reading and writing means for detecting said special sequence of parity pattern; and
    c. means responsive to said detecting means for re-establishing frame synchronization upon the detection of said special sequence of parity pattern.

5. The improvement as recited in claim 4 wherein said inserting means includes means for generating said special sequence parity and means for inhibiting said special sequence parity during the recovery of frame synchronization, and said detecting means includes:
    a. parity generator and checking means responsive to said generating means and receiving directly the data input to said reading and writing means the data read out of said memory system by said reading and writing means for generating or checking the parity bits in said one loop; and
    b. pattern recognizer means responsive to the output of said parity generator and checking means for comparing the parity bits with said special sequence of parity pattern and producing an enabling signal to said inserting means on the detection of a high correlation between the parity bits and said special sequence of parity pattern.

6. The improvement as recited in claim 5 wherein said memory system is a magnetic bubble domain memory having a major/minor loop configuration and said parity generator and checking means comprises a serial modulo 2 adder.

7. The improvement as recited in claim 5 wherein said memory system is a magnetic domain memory having a one-loop-per-chip structure and said parity generator and checking means comprises a parallel modulo 2 adder.

8. A dynamic non-destructive memory system comprising:
    a. a plurality of recirculating data loops;
    b. a recirculating loop used to store the parity of corresponding bits of said data loops;
    c. means for reading and writing data and parity bits in said recirculating loops;
    d. means connected to said reading and writing means for inserting a special sequence of parity pattern exhibiting a peaked autocorrelation function at the end or start of the frame in place of the normal parity in said parity loop; and
    e. means responsive to said reading and writing means for detecting said special sequence of parity pattern to re-establish frame synchronization.

9. A memory system as recited in claim 8 wherein said data loops and said parity loop are formed in a thin magnetic film.

10. A memory system as recited in claim 9 wherein said memory system is a magnetic bubble domain memory.

* * * * *